United States Patent [19]

Deas

[11] Patent Number: 5,721,741
[45] Date of Patent: Feb. 24, 1998

[54] MEMORY TEST SYSTEM

[75] Inventor: Alexander Roger Deas, Edinburgh, Scotland

[73] Assignee: Memory Corporation, Edinburgh, Scotland

[21] Appl. No.: 767,393

[22] Filed: Dec. 16, 1996

Related U.S. Application Data

[63] Continuation of PCT/GB95/01392, Jun. 15, 1995.

[30] Foreign Application Priority Data

Jun. 15, 1994 [GB] United Kingdom ............... 9411950

[51] Int. Cl.[6] ........................................... G06F 11/00
[52] U.S. Cl. ............................. 371/22.1; 371/21.6
[58] Field of Search ........................... 365/201, 187; 371/22.1, 22.4, 24, 26, 21.6

[56] References Cited

U.S. PATENT DOCUMENTS 5,461,588  10/1995  Sardeson et al. .................. 371/21.1
5,532,963  7/1996  Koshiyama et al. ................ 365/201

FOREIGN PATENT DOCUMENTS 2 262 839  6/1993  United Kingdom .

*Primary Examiner*—Vincent P. Canney
*Attorney, Agent, or Firm*—Cushman, Darby & Cushman IP Group of Pillsbury, Madison & Sutro LLP

[57] ABSTRACT

A process for reducing the test requirements of memory devices once they are packaged into modules by using a unique identification of a memory device based on the locations or types and locations of some of the defects in that memory device. The unique identification is used as an index to access a database containing more information on the types and locations of defects within that memory device. The information is then stored in a non-volatile memory on the module containing that memory device.

7 Claims, 2 Drawing Sheets

MEMORY TEST SYSTEM

This is a Continuation of: International Application No. PCT/GB95/01392 filed Jun. 15, 1995 which designated the U.S.

INTRODUCTION

This invention relates to a chip identification method for use in the production of modules populated with semiconductor devices. This invention is a process for recording all of the defects in a partially working memory chip and programming the addresses of the defects into a non-volatile store, which is used in conjunction with a partial memory system for replacing faulty cells in a memory array.

APPLICATION

The present invention is applicable in particular, though not exclusively, to solid state memory devices in partial memory systems.

BACKGROUND

In the semiconductor industry, solid state memory devices are fabricated as a large number of die in wafers of silicon, each die containing a memory array. These die are tested, parametrically graded, and the die which are perfect, or which can be made to work perfectly, are packaged for use. Faulty die may be functionally graded; those die with comparatively few defective cells may be sold as partially working devices. These partially working devices have a value considerably lower than the value of perfectly working devices, yet in many cases they contain only a few defective memory locations. For this reason, a number of schemes have been developed which use partially working devices in memory systems. One such memory system is described in international patent application PCT/GB94/00577.

In testing memory chips it is necessary to record the locations of all defects in each memory chip, otherwise the chip could not be used in a memory system which is designed to work perfectly. There are many different faults that can occur in a memory cell array, including parametric faults and functional faults. The functional faults can be classified as single faults (faults that involve only a single cell, for example, stuck-at, stuck-open, transition, and data retention faults) and coupling faults (faults whereby a cell influences the behavior of another cell, for example, inversion, idempotent, state coupling faults, and linked faults). A stuck-at fault is when the logic value of a cell is constant at a certain value, either zero or one. A stuck-open fault is when a cell cannot be accessed. A transition fault is when a cell fails to undergo a zero to one transition or a one to zero transition. A data retention fault is when a cell fails to maintain its logic level after some period of time. An inversion coupling fault involves two cells, one of which has its state inverted by a transition in the other cell. An idempotent fault also involves two cells, one of which is forced to a particular logic level by a transition write operation to the first cell. A state coupling fault is similar to the inversion and idempotent faults but differs in that the change in a cell results from some connection between two lines and not from a write transition. A linked fault is when two or more coupling faults affect the same cell.

Any memory system that uses partial memory devices (memory devices that contain faulty locations but which are still capable of being used, albeit with some redundancy techniques) is only as good as its ability to detect and replace faulty locations. However, once partially working silicon die are packaged and incorporated into modules (for example into Single In-line Memory Modules [SIMMs]) testing the die thoroughly is more difficult than when the die are unpackaged or still part of the wafer on which they were fabricated. There are a number of reasons for this. When a die is packaged then a test engineer no longer has access to the substrate of the die to apply a bias voltage. In addition, when a number of die are mounted onto a SIMM then the module can only be tested as a unit, individual integrated circuits cannot be probed via the edge connector.

Due to practical limitations, it is not usually possible to locate all of the cell locations in chips on a module which might become defective under certain conditions. As a result, some faulty memory, locations may not be detected in the memory test routines which are applied to the module. If thorough tests are performed on the die, however, then most of the cells that are liable to fail can be detected. If some cells that are failures or are liable to fail are not detected then this represents a major drawback to memory replacement schemes with redundancy, since many applications will not tolerate any defective locations in memory. The present invention relates to a method of overcoming this difficulty.

ADVANTAGES OF INVENTION

One advantage of the present invention is that it enables chips within modules to be identified once a basic test has been performed. When a chip has been identified then full test data, recorded when the chip was tested prior to assembly, can be accessed from a database. Thus the invention provides a link between an integrated circuit as tested and the same circuit as mounted on a module such as a SIMM.

OBJECT OF INVENTION

It is an object of the present invention to provide a process that reduces the test requirements of semiconductor die or chips once they are packaged into modules.

It is another object of the present invention to provide an automated system for identifying chips.

It is another object of the present invention to provide a chip identification system which does not adversely affect chip real estate area.

It is another object of the present invention to provide a chip identification system which does not introduce additional stages into the manufacturing process of memory modules. For example, laser writing or scribing.

It is another object of the present invention to provide a chip identification system in which the identification information can be recorded either before or after dicing of the wafer into individual chips.

It is a further object of the present invention to provide a method of tracking an integrated circuit from the initial testing of the die to packaging of the integrated circuit onto modules.

PRIOR ART

A number of identification techniques have been proposed for integrated circuits. European Patent application EP 0 132 520 describes a method of writing unique identification data on each chip (integrated circuit) that is both human and machine readable. In EP 0 132 520 the data must be written to the back of each chip prior to dicing of the wafer. U.S. Pat. No. 4,150,331 discloses an individual chip identification utilising programmable circuitry on the chip surface in which a signature for that chip may be encoded. The present invention differs from the prior art in that it provides a signature based on the electrical characteristics of the circuit. Thus, no physical identification or mark is applied to the integrated circuit or to any part of its packaging.

SUBSTANCE OF INVENTION

The substance of the invention is a process for using the addresses of faulty locations within a memory chip as a unique identification for the said memory chip so that the said memory chip can be recognised easily at any subsequent time by performing a memory test, and information relating to the faults on the said memory chip can be retrieved from a database. Thus, the invention is a process which involves testing a memory device, noting the address and optionally type of every fault detected in the said memory device, storing the said address and optionally type of each fault detected in a record for the said memory device, assembling a plurality of the said devices onto a module, testing the said module with a less thorough test than the test which was applied to the individual devices, accessing the records relating to the devices in the said module by using the location and optionally type of the said faults on the said memory devices in the said module to index the full record of faults for each said memory device, and programming the said addresses of faulty memory locations from the full record into a non-volatile memory for use in conjunction with a partial memory system for replacing faulty cells in a memory array.

PREFERRED EMBODIMENTS

For a better understanding of the present invention and to show how the same may be carried into effect, reference will now be made, by way of example, to the accompanying drawings in which.

Figure 1:
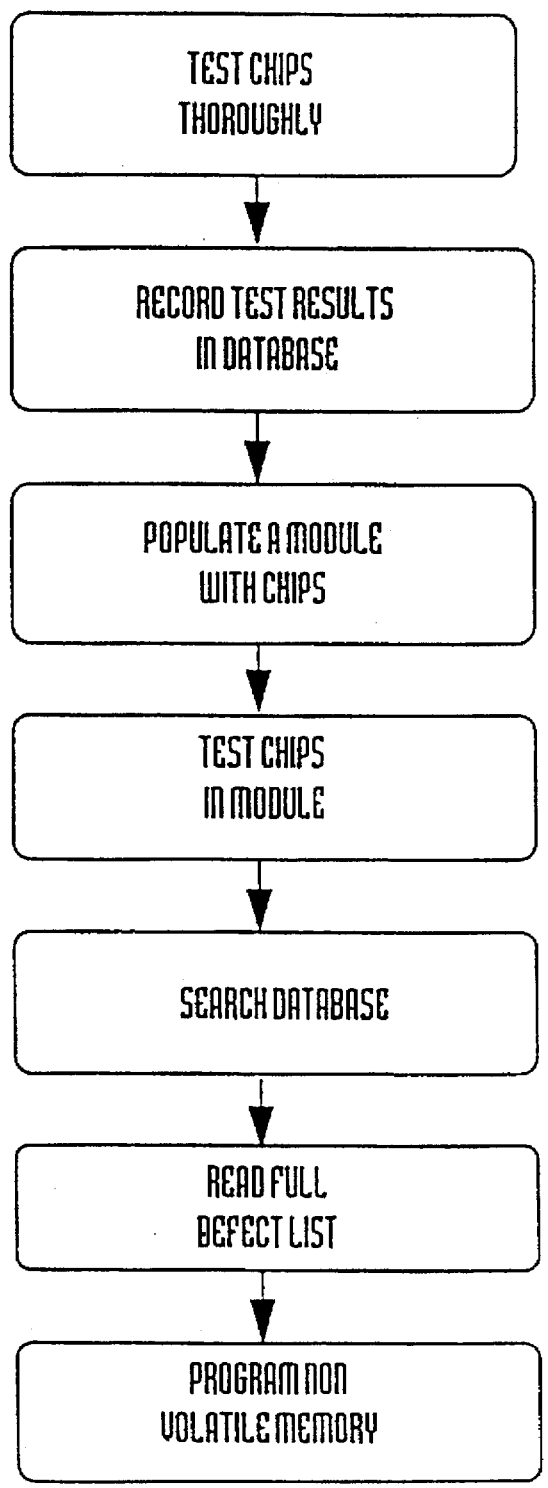
FIG. 1 shows a flowchart with various processing steps for implementing a basic embodiment of the present invention.
Figure 2:
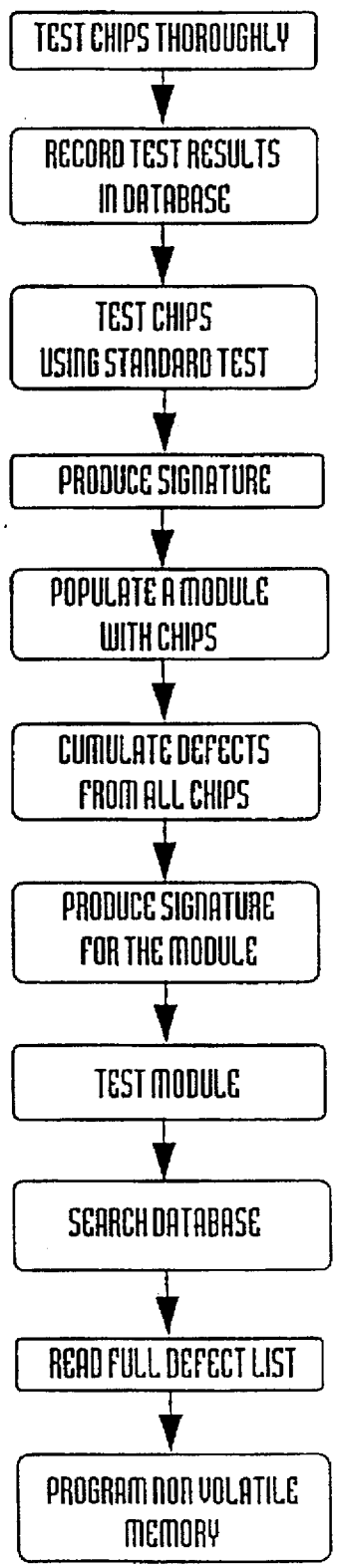
FIG. 2 shows a flowchart with various processing steps for implementing the present invention.

The first stage of the process illustrated in FIG. 1 is to characterize the memory chips (integrated circuits) thoroughly by testing them. Typically, testing of die or bonded chips is divided into two parts: parametric testing and functional testing. One of the most important considerations is that the functional test or tests should be extensive enough to disclose as many of the faulty cell locations as possible, including single faults and coupling faults. Suitable test routines may be performed with the chip at different temperatures, and using supply voltages above and below the nominal supply voltage in addition to testing at the nominal supply voltage. Tests may also be performed for different values of input low voltage ($V_{1L}$) and for different values of input high voltage ($V_{1H}$). Typically, these tests may take thirty seconds or more to perform. Tests are designed to locate a particular type or particular types of fault so the test routine that is chosen to exercise the memory chip is very important.

An example of a typical test routine is the march test. This test may involve writing a logic zero to all locations on the memory chip, reading each location to verify that a logic zero is stored, then writing a logic one to each location and reading each location to verify that a logic one is stored. This process is repeated a number of times. The march test in combination with a row/column disturb test locates a number of different types of faults. including: address faults, stuck-at faults, transition faults, unlinked idempotent coupling faults, unlinked inversion coupling faults, and state coupling faults.

Other tests which could be used in addition to the march test include column and row disturb tests, walking cell surround tests, and sense amplifier recovery tests.

Once the test or tests have been performed on a memory chip then all of the addresses of faults which have been discovered and the type of fault which was uncovered are stored in a record for that chip. The record for each chip may store other data relating to the chip, for example, manufacturing codes relating to wafer type, part number, production controls, and the date of manufacture of the wafer. The record for each chip may contain a signature for that chip, where the signature is a mathematical or arithmetic function of some of the defects on the chip. The record for each chip may also store data relating to other chips which are on the same module. For example, the position of each of the other chips on the module, the defects on each of the other chips on the module, or the signatures of each of the other chips on the module. The record for each chip may contain information relating to the module on which the chip is mounted, for example, the signature of the module. The signature of a module may be generated from the combination of the defects on each chip in the module. In some embodiments of this invention only the addresses, not the fault types, are stored in a record for that chip.

Suitable storage records are computer databases which store a sequence of digits for each location which is faulty. Most of the digits in each particular record will correspond to the address of the location that is faulty, but one or two digits may also be included to indicate the type of fault. For example, a stuck-at zero fault might have the code 00, a stuck-at one fault might have the code 01, and a data retention fault 02. Thus, a stuck-at one fault at address 11133322 might have an entry in the record of 1113332201. Obviously, the two digit code could be put at the beginning, end, or even within the address. The address given in this example is an 8 bit address, however the same principle applies for chips that require more or fewer address bits to address uniquely each memory location. The record for each chip will contain one entry for each faulty location. Thus, the record for each chip may be a different size. In some circumstances the addresses of faulty rows or columns rather than the address of each faulty, cell may be stored. This would decrease the overall size of the record but would not result in any loss of information. When a number of chips have been tested, the results can be stored in a database containing all of the records. The database may have a tree structure, or some form of indexing may be used to increase the searching speed of the database.

One form of indexing that may be used is to give each chip a signature based on some function of the faulty locations on the chip. The signature could be based on the defective locations disclosed by a particular test, for example a march test. Whenever a chip is to be identified a march test would be performed and a standard function would be applied to the resulting faulty locations to determine the signature of the chip. This signature could be used as an index to access the full list of defective locations. At any subsequent time the chip could be tested using a march test in combination with a row/column and surround disturb test and the resulting defective locations operated on by the standard function, this would reproduce the signature of the chip.

The third stage in the process is to package the chips into modules. In this embodiment, DRAM (Dynamic Random Access Memory) chips are used, and these DRAM chips are assembled into SIMMs (Single In-line Memory Modules).

Once a SIMM is assembled it is tested using a test pattern which will locate a certain type of fault, for example, stuck-at zero and stuck-at one faults. This test will usually be briefer than the initial test of the chips. It is possible to perform this type of test in a few seconds. The addresses of the cell locations which are stuck-at zero and stuck-at one are recorded. This is the fourth stage in the process shown in FIG. 1.

The fifth stage in the process uses the results from the module test as an index to search the database containing all of the defects which were discovered during the initial test. The database is searched to find an entry that matches these fault types and locations. The probability of two chips having identical faulty locations as discovered by the test of the module (the second test) is negligible because each chip has (typically) millions of cells. The larger the storage capacity of the chips (i.e. the greater the number of cells), the smaller the probability of two chips having identical fault patterns. Most SIMMs use DRAMs which have at least 1 Mb of storage capacity, therefore the probability of two chips from a batch of one thousand having identical faulty locations is very slight. Only the entry codes in the database which correspond to the particular fault type (in this case stuck-at zero and stuck-at one) need to be searched. This greatly reduces the time required to search the database. There are other schemes of searching the database, the one that is described here is given merely by way of example. In embodiments which do not store the fault type in the database the addresses of the faulty locations are compared with the addresses in the database.

If there were occurrences of two chips having identical fault patterns then a separate database could be used for each batch of chips. The batch size would be chosen so that the probability of having chips with identical faults was very small, for example a batch of chips might contain a hundred, a thousand or ten thousand chips.

The sixth stage in the process occurs once the comparison has been performed and a match has been found between those faults discovered when the module is tested and those faults listed in the database. When a match is found, then the appropriate record is read from the database. The entire record is read and the bits which correspond to the fault type and any other non-address bits that are present are stripped, leaving only the addresses of faulty locations.

The final stage in the process is to output the addresses of the faulty locations contained in the database to a programmer in a suitable format. The programmer then programs these addresses into a non-volatile memory, which is used in conjunction with a partial memory system for replacing faulty cells in a memory array. The format of the output will depend on the format which is required by the non-volatile memory. Suitable non-volatile memory devices include: EEPROMs, Flash EPROMs and One Time Programmable ROMs.

In other embodiments of the present invention each module is tested with a standard test such as a march test in combination with a row/column disturb test and a standard function is performed on the list of defective locations on the module. This produces a signature for the module which is used to access a database containing all of the defective locations on the module (i.e. all of the defective locations in the chips on the module). If the module signature does not match any of the signatures stored in the database as relating to modules then one of the chips can be tested to generate a signature for that chip. The chip signature is then used to access the database containing the record of faulty locations for that chip. There may be two databases, one for chips and another for modules, or the two sets of data may be included in the one database.

It will be appreciated that various modifications may be made to the embodiment described above within the scope of the present invention. For example the process may be used to determine the types of chips which are assembled on a module that has been returned because it does not work properly. This could be done either by using the module signature method or by using the chip signature method.

I claim:

1. An integrated circuit identification method for use in semiconductor device module production, comprising the steps of:

testing one of a plurality of memory devices to note the address locations of faulty cells in the said memory device;

storing the said address locations of the said faulty cells in a record of faulty cells for the said memory device;

assembling a plurality of the said memory devices onto a module;

testing the said module with a less thorough test than the test which was applied to the said memory device to obtain a set of faulty cell locations;

accessing the said record for the said memory device by using a portion of the said set of faulty cell locations to index the said record of faulty cells;

transferring the said record of faulty cells to a non-volatile memory on the module.

2. The method of claim 1, further comprising the step of using the module identification process for determining the chips which are assembled onto a module that is returned from actual use.

3. The method of any preceding claim wherein the said record of faulty cells includes manufacturing information.

4. The method of claim 1 wherein the said record of faulty cells includes information relating to the type of defect at each cell location.

5. The method of claim 1 wherein the said record of faulty cells includes the addresses of rows and/or columns that are defective in addition to or instead of the addresses of faulty cells.

6. The method of claim 1 wherein the said module is a Single In-line Memory Module.

7. The method of claim 1 where the said record of faulty cells is a computer database.

* * * * *